US011488802B2

(12) United States Patent
Tan et al.

(10) Patent No.: US 11,488,802 B2
(45) Date of Patent: Nov. 1, 2022

(54) SEMICONDUCTOR DEVICE FOR CONDITION-CONTROLLED RADIO FREQUENCY SYSTEM

(71) Applicant: Piotech Inc., Shenyang (CN)

(72) Inventors: Huaqiang Tan, Shenyang (CN); Saiqian Zhang, Shenyang (CN)

(73) Assignee: Piotech Inc., Shenyang (CN)

( * ) Notice: Subject to any disclaimer, the term of this patent is extended or adjusted under 35 U.S.C. 154(b) by 0 days.

(21) Appl. No.: 17/352,449

(22) Filed: Jun. 21, 2021

(65) Prior Publication Data

US 2021/0398771 A1 Dec. 23, 2021

(30) Foreign Application Priority Data

Jun. 19, 2020 (CN) .......................... 202010566407.6

(51) Int. Cl.
*H01J 37/244* (2006.01)
*H01J 37/32* (2006.01)

(52) U.S. Cl.
CPC ...... *H01J 37/244* (2013.01); *H01J 37/32174* (2013.01); *H01J 2237/24564* (2013.01)

(58) Field of Classification Search
CPC .... H01J 37/32; H01J 37/244; H01J 37/32174; H01J 37/3288; H01J 2237/24564; G01R 19/0084; G01R 19/04; H01L 21/67069
See application file for complete search history.

(56) References Cited

U.S. PATENT DOCUMENTS

| | | | |
|---|---|---|---|
| 7,527,016 B2 | 5/2009 | Yamazawa et al. | |
| 9,508,529 B2 | 11/2016 | Valcore, Jr. et al. | |
| 10,128,160 B2 | 11/2018 | Sakiyama et al. | |
| 10,373,794 B2 | 8/2019 | Burkhart et al. | |
| 2016/0049323 A1* | 2/2016 | Ye | H01L 21/68757 361/234 |

FOREIGN PATENT DOCUMENTS

| | | |
|---|---|---|
| CN | 101523357 B | 1/2013 |
| CN | 103120032 A | 5/2013 |
| CN | 107710378 A | 2/2018 |
| TW | 200402759 A | 2/2004 |
| TW | 200525622 A | 8/2005 |
| TW | 201729650 A | 8/2017 |
| WO | 2005055283 A2 | 6/2005 |

OTHER PUBLICATIONS

Taiwan Office Action dated Jun. 2, 2022 from corresponding Taiwan Application No. 110122495.

* cited by examiner

*Primary Examiner* — Henry Luong
(74) *Attorney, Agent, or Firm* — Blank Rome LLP

(57) ABSTRACT

This application relates to a semiconductor device for a condition-controlled radio frequency (RF) system. In an embodiment of this application, an RF detection apparatus includes: a high-pass filter (HPF), one end of which is electrically coupled to an RF loop electrode of a ceramic heater, and another end of which is grounded; a voltage measurer, connected to the HPF in parallel; and a low-pass circuit, connected to the HPF in parallel.

9 Claims, 4 Drawing Sheets

SEMICONDUCTOR DEVICE FOR CONDITION-CONTROLLED RADIO FREQUENCY SYSTEM

CROSS-REFERENCE TO RELATED APPLICATIONS

This application claims priority to Chinese Patent Application No. 202010566407.6 filed on Jun. 19, 2020, and all the benefits accruing therefrom under 35 U.S.C. § 119, the contents of which in its entirety are herein incorporated by reference.

BACKGROUND OF THE INVENTION

1. Field of the Invention

The present disclosure relates to a semiconductor radio frequency (RF) treatment apparatus, and in particular, to a semiconductor device for a condition-controlled RF system.

2. Description of the Related Art

A plasma treatment device for performing treatment such as plasma-enhanced chemical vapor deposition (PECVD) on a semiconductor wafer may be referred to as an RF system, including an RF control circuit. The RF control circuit may provide an RF signal and transfer the RF signal to an electrode in the plasma treatment device, thereby generating an electric field in a treatment region of a treatment chamber. A reactant gas is ionized under the action of the electric field and has such a reaction as etching or deposition with the to-be-treated wafer.

Monitoring a daily condition of the RF system has significance for process development and long-term stability of the device. In addition to monitoring changes in a forward power of an RF power supply, a reflection power of the RF system, and an adjustable capacitance of a matcher, signal parameters such as a direct-current bias (Vdc) and an RF bias amplitude (Vpp) of an RF emitter need to be further monitored, and then a condition of the RF system is monitored. Usually, a location of monitoring the signal parameters of the RF emitter is disposed between the RF emitter and the RF matcher, and an individual sensor module or a sub-module integrated in the RF matcher is used for monitoring the condition of the RF system.

However, a matcher including a function module for monitoring the condition of the RF system is usually relatively expensive. For a matcher including no function module for monitoring the condition of the RF system, a system condition monitoring module is usually added additionally between the RF emitter and the RF matcher, causing the total costs to be stubbornly high.

Therefore, it is necessary to develop an apparatus for monitoring a condition of an RF system, where the apparatus gives consideration to both monitoring effectiveness and low costs, so as to implement an identical or similar monitoring function.

SUMMARY OF THE INVENTION

This application aims to provide an apparatus for monitoring a condition of an RF system, so as to implement a function of monitoring the condition of the RF system in a case that a matcher lacks a function module for monitoring the condition of the RF system.

An embodiment of this application provides an RF detection apparatus, including: a high-pass filter (HPF), one end of which is electrically coupled to an RF loop electrode of a ceramic heater, and another end of which is grounded; a voltage measurer, connected to the HPF in parallel; and a low-pass circuit, connected to the HPF in parallel.

Another embodiment of this application provides an RF detection apparatus, including: an HPF, one end of which is electrically coupled to an RF loop electrode of a ceramic heater, and another end of which is grounded; a voltage measurer, connected to the HPF in parallel; and a low-pass circuit, one end of which is electrically coupled to the RF loop electrode of the ceramic heater, and another end of which is electrically coupled to an RF function module.

It should be understood that the broad forms of the present disclosure and respective features thereof may be used in combination, interchangeably and/or independently, and are not used intended to limit the reference to a single broad form.

PREFERRED EMBODIMENT OF THE PRESENT INVENTION

To better understand the spirit of the present disclosure, a further description is provided below in conjunction with some preferred embodiments of the present disclosure.

In this specification, unless specifically specified or defined, relative terms such as: "central", "longitudinal", "lateral", "front", "rear", "right", "left", "inner", "outer", "low", "high", "horizontal", "vertical", "higher", "lower", "above", "below", "top portion", "bottom portion", and their derivative terms (such as "horizontally", "downward", "upward", and the like) should be interpreted as referring to directions described in the discussion or shown in the accompanying drawings. These relative terms are merely used for ease of description, and do not require constructing or operating this application in a specific direction.

Hereinafter, various implementations of the present disclosure will be described in detail. Although specific implementations are discussed, it should be understood that these implementations are merely for illustrative objectives. A person skilled in the relevant art will recognize that other components and configurations may be used without departing from the spirit and the protection scope of the present disclosure.

Figure 1:
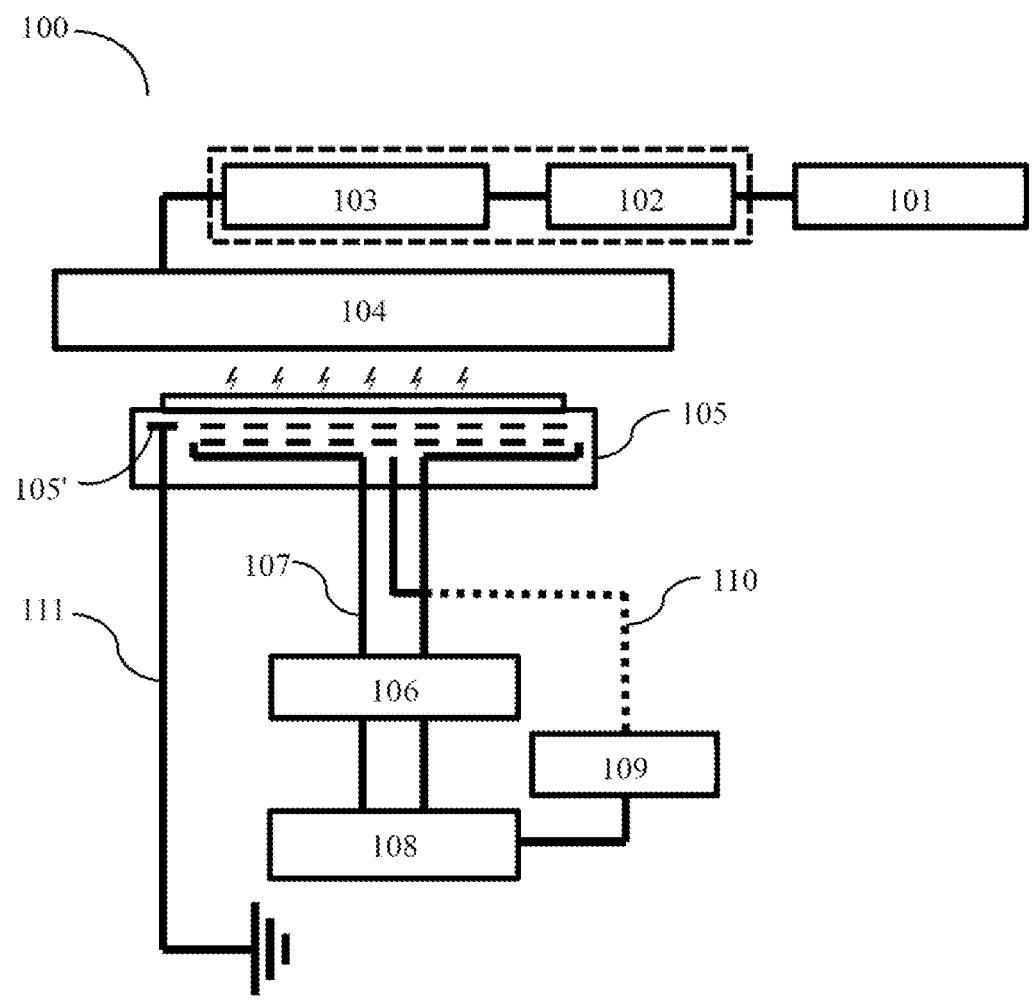
FIG. 1 shows an apparatus for monitoring a condition of an RF system according to an embodiment of the present disclosure.

FIG. 1 shows an apparatus for monitoring a condition of an RF system according to an embodiment of the present disclosure. A front end of an RF system 100 may include an RF signal generator 101, a matcher 102, an apparatus 103 for monitoring a condition of the RF system, and a shower plate 104. The RF signal generator 101 outputs an RF signal and provides the RF signal to the matcher 102. The matcher 102 receives the RF signal and performs circuit modulation on the RF signal, so that the impedance of the RF signal is matched with that of a load. The matched RF signal is finally provided to the shower plate 104, and the shower plate 104 forms an RF emitter. The apparatus 103 for monitoring a condition of the RF system is connected in series between the matcher 102 and the shower plate 104 to monitor signal parameters of the RF emitter such as a direct-current bias (Vdc) and an RF bias amplitude (Vpp), thereby directly monitoring a system condition of the RF system 100. In FIG. 1, the apparatus 103 for monitoring a condition of the RF system and the matcher 102 that are located in a dashed line box may be used to represent a matcher having a function of monitoring the condition of the RF system, and such a matcher is usually relatively expensive. On the contrary, if the dashed line box in FIG. 1 is ignored, it indicates that the matcher 102 has only a matching function but has no Vdc and Vpp condition monitoring function. In this case, to meet the system condition monitoring requirement, in the technology shown in FIG. 1, the apparatus 103 for monitoring a condition of the RF system needs to be further added additionally between the shower plate 104 and the matcher 102, and such modification still causes the total costs to be stubbornly high.

A back end of the RF system 100 may include a ceramic heating plate 105, a heating circuit low-pass filter (LPF) 106, a heating circuit 107, an alternating-current (AC) power controller 108, a temperature controller 109, a temperature control circuit 110, and an RF loop line 111. The ceramic heating plate 105 forms an RF receiver, and is directly grounded through an RF loop electrode 105' on the ceramic heating plate 105 and through the RF loop line 111. One end of the heating circuit 107 may be placed in the ceramic heating plate 105 (as shown by a dashed line in the ceramic heating plate 105 in FIG. 1), and another end may be connected to the heating circuit LPF 106. After being filtered through the heating circuit LPF 106, AC power or electric power outputted by the AC power controller 108 heats the ceramic heating plate 105 through the heating circuit 107, and then heats a wafer located above the ceramic heating plate 105, to facilitate PECVD treatment. The temperature control circuit 110 may be connected to the one end of the heating circuit 107 that is placed in the ceramic heating plate 105, so as to acquire temperature information and transfer the temperature information to the temperature controller 109, and the temperature controller 109 may provide a feedback signal to the AC power controller 108 according to the acquired temperature information to adjust the AC heating power, thereby implementing feedback control of the temperature of the heating plate.

Figure 2A:
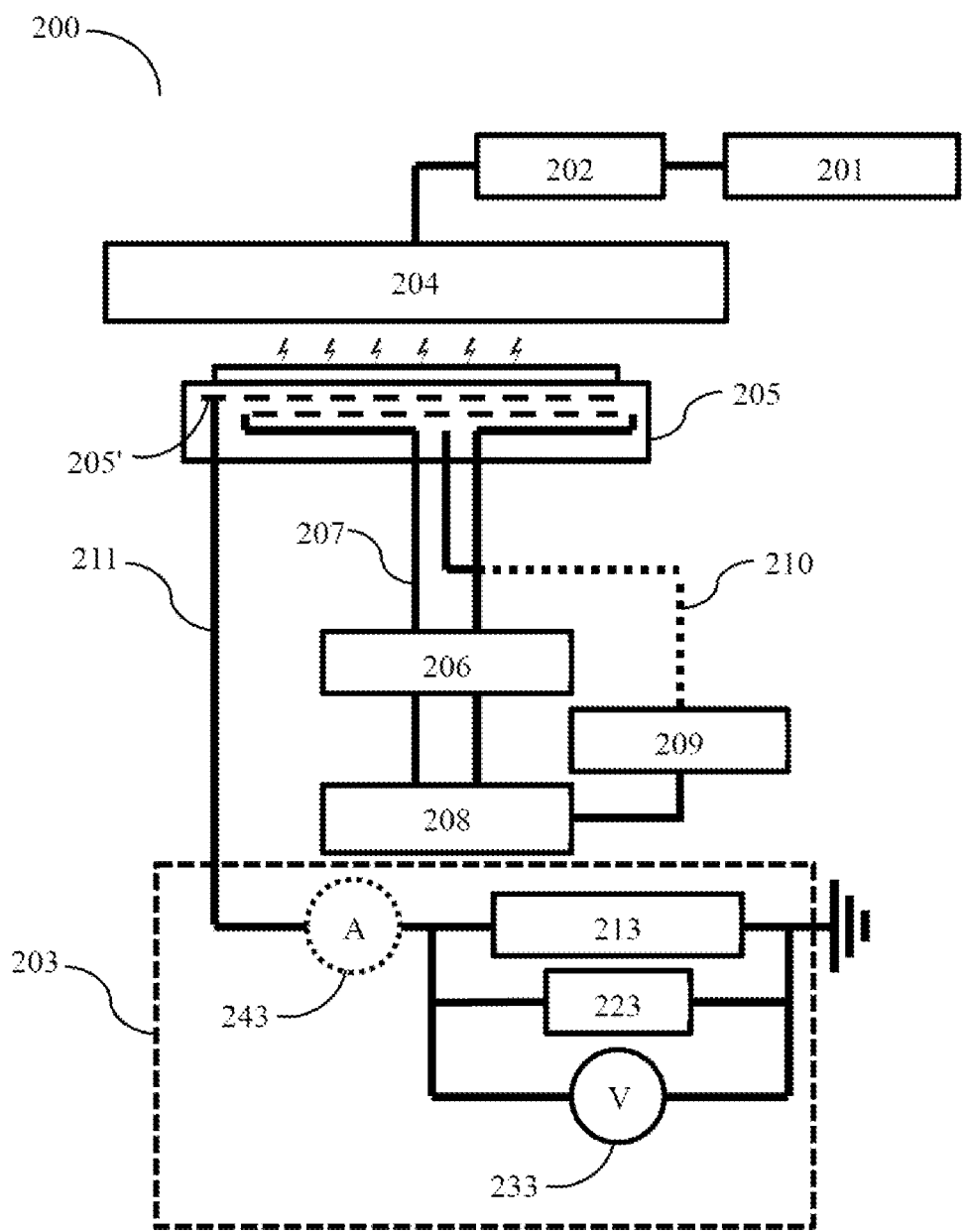
FIG. 2A shows an apparatus for monitoring a condition of an RF system according to an embodiment of the present disclosure.

FIG. 2A shows an apparatus for monitoring a condition of an RF system according to an embodiment of the present disclosure. A front end of an RF system 200 may include an RF signal generator 201, a matcher 202, and a shower plate 204. The RF signal generator 201 outputs an RF signal and provides the RF signal to the matcher 202. The matcher 202 receives the RF signal and performs circuit modulation on the RF signal, so that the impedance of the RF signal is matched with that of a load. The matched RF signal is directly provided to the shower plate 204, and the shower plate 204 forms an RF emitter. In FIG. 2A, a front end of the RF system 200 includes no Vdc and Vpp condition monitoring apparatus, and the RF signal outputted from the matcher 202 is directly provided to the shower plate 204. That is to say, according to this embodiment of the present disclosure, the front end of the RF system 200 shown in FIG. 2A may directly monitor a system condition of the RF system 200 without monitoring signal parameters of the RF emitter such as a direct-current bias (Vdc) and an RF bias amplitude (Vpp).

A back end of the RF system 200 may include a ceramic heating plate 205, a heating circuit LPF 206, a heating circuit 207, an AC power controller 208, a temperature controller 209, a temperature control circuit 210, and an RF loop line 211. The ceramic heating plate 205 forms an RF receiver, and has an RF loop electrode 205'. At the back end of the RF system 200 shown in FIG. 2A, the apparatus 203 for monitoring a condition of an RF system is connected in series between the RF loop electrode 205' of the ceramic heating plate 205 and the ground, and therefore the ceramic heating plate 205 is directly grounded without the aid of the RF loop line 211. The apparatus 203 for monitoring a condition of an RF system may monitor a signal on the RF loop line 211 (for example, signal parameters of the RF receiver such as a direct-current bias (Vdc) and an RF bias amplitude (Vpp)), thereby indirectly monitoring a system condition of the RF system 200.

Still referring to FIG. 2A, the apparatus 203 for monitoring a condition of an RF system connected in series between the ceramic heating plate 205 and the ground includes a high-pass filter (HPF) 213, a low-pass circuit 223, and a voltage measurer 233. The HPF 213 and the low-pass circuit 223 form a high-frequency branch and a low-frequency branch of the RF loop line 211 respectively. The HPF 213 has one end electrically coupled to the RF loop electrode 205' of the ceramic heater plate 205, and another end grounded, thereby being connected to the RF loop line 211 in series. The HPF 213 may be configured to ensure normal operations of an RF loop. The low-pass circuit 223 is connected to the HPF 213 in parallel, so as to shunt a low-frequency RF current. The voltage measurer 233 is connected in parallel between two ends of the HPF 213 and the low-pass circuit 223, so as to perform real-time or non-real-time measurement on a parallel voltage of the HPF 213 and the low-pass circuit 223, thereby monitoring, for example (but not limited to), the signal parameters of the RF emitter such as the direct-current bias (Vdc) and the RF bias amplitude (Vpp), and then indirectly monitoring a condition of the RF system. When the RF loop normally operates, a measured value of the voltage measurer 233 may be, for example, 0 or a tiny value. In an embodiment, the voltage measurer may be a voltmeter or any type of voltage measurement apparatus. In another embodiment, an ammeter 243 may be further connected in series on the RF loop line 211 to measure a total current flowing through the HPF 213 and low-pass circuit 223, thereby assisting in monitoring a condition of the RF system.

Figure 2B:
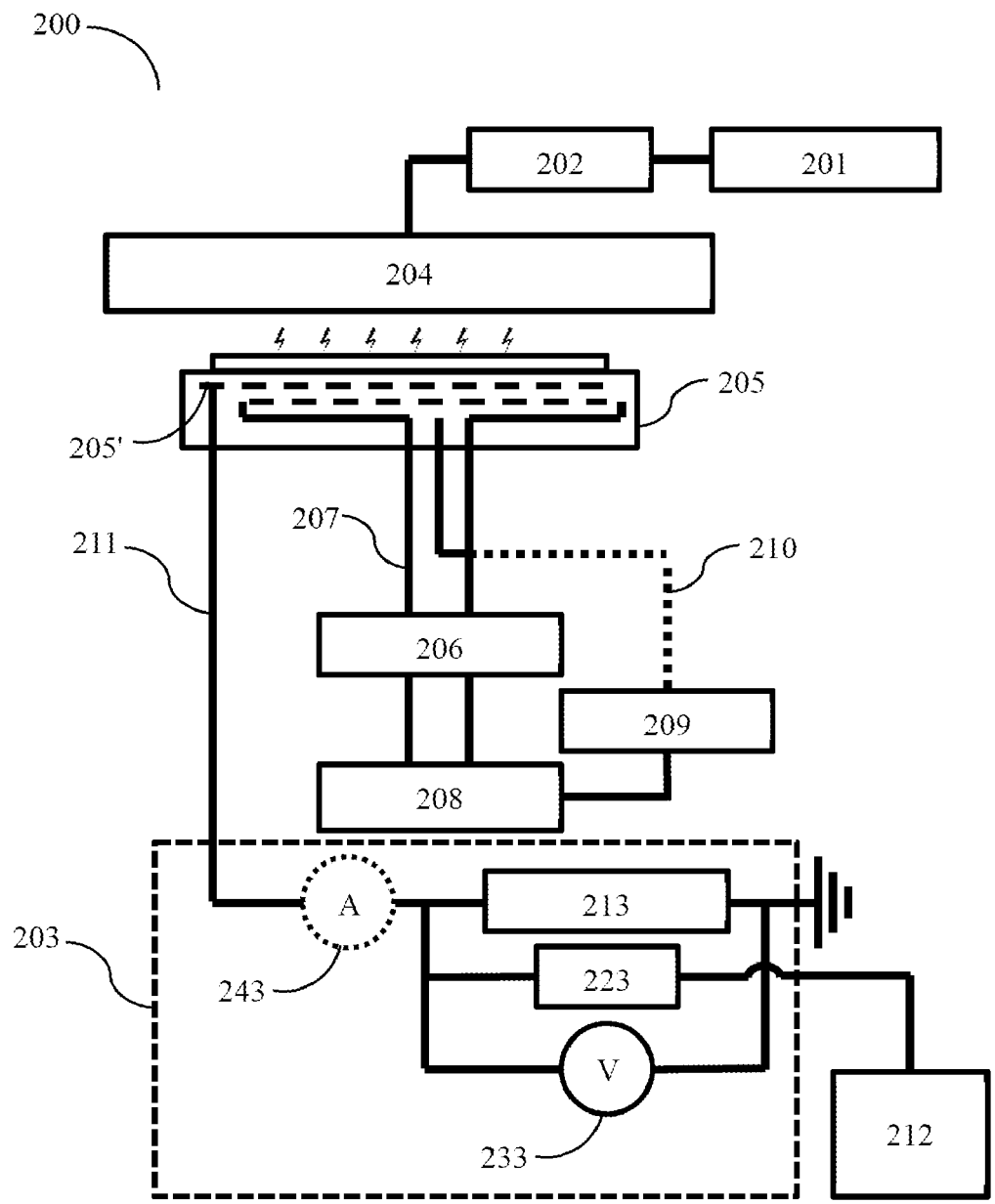
FIG. 2B shows an apparatus for monitoring a condition of an RF system according to another embodiment of the present disclosure.

FIG. 2B shows an apparatus for monitoring a condition of an RF system according to another embodiment of the present disclosure. Different from the RF system 200 shown in FIG. 2A, a low-pass circuit 223 has one end electrically coupled to an RF loop electrode 205' of a ceramic heater plate 205, and another end connected to another function module 212, and therefore is not connected to an HPF 213 in parallel. The another function module 212 may be, for example (but not limited to), an electrostatic chuck (E-Chuck or ESC for short). In this embodiment shown in FIG. 2B, a voltage measurer 233 still keeps connected to the HPF 213 in parallel, so as to perform real-time or non-real-time measurement on a parallel voltage of the HPF 213, thereby monitoring, for example (but not limited to), the signal parameters of the RF emitter such as the direct-current bias (Vdc) and the RF bias amplitude (Vpp), and then indirectly monitoring a condition of the RF system.

Figure 3:
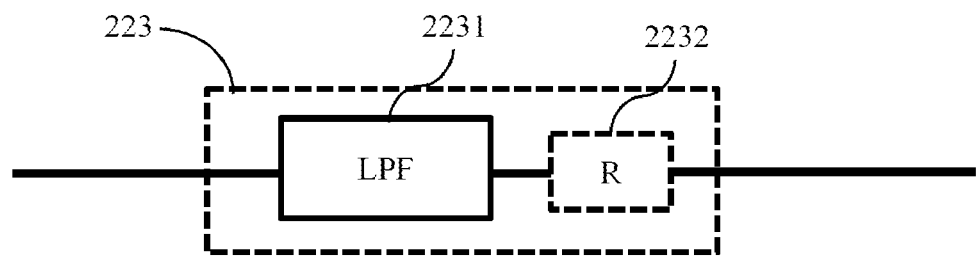
FIG. 3 shows an embodiment of a low-frequency branch in FIG. 2A and FIG. 2B.

FIG. 3 shows an embodiment of a low-frequency branch in FIG. 2A and FIG. 2B. As shown in FIG. 3, the low-pass circuit 223 forming the low-frequency branch of the RF loop line 211 may include an LPF 2231, so as to implement grounding or conduction of all low-frequency currents. In an embodiment, the low-pass circuit 223 may further include a resistor (R) 2232 connected to the LPF in series, so as to further provide a current-limiting function.

Figure 4:
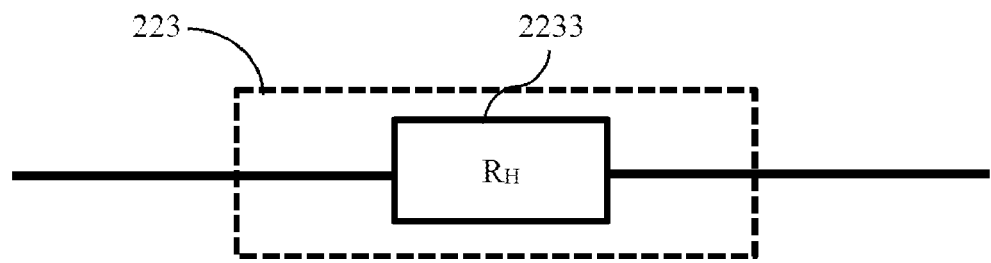
FIG. 4 shows another embodiment of a low-frequency branch in FIG. 2A and FIG. 2B.

FIG. 4 shows another embodiment of a low-frequency branch in FIG. 2A and FIG. 2B. As shown in FIG. 4, the low-pass circuit 223 forming the low-frequency branch of the RF loop line 211 may be formed by only a high-voltage resistor ($R_H$) 2233, so as to replace the LPF 2231 and/or the resistor 2232 shown in FIG. 3. It should be understandable that, the embodiment of the low-frequency branch shown in each of FIG. 3 and FIG. 4 may be used to implement the low-pass circuit 223 of the RF system 200 shown in FIG. 2A and FIG. 2B.

For RF systems with different frequencies, high-frequency branches and low-frequency branches with different filtering performance may be configured to optimize monitoring performance. For example (but not limited to), different filtering performance may be provided for RF systems with different frequencies by configuring filtering ranges of the HPF and the LPF.

The semiconductor device provided in each embodiment of the present disclosure can implement, by disposing a voltage and/or current measurement apparatus and a matched electric component on a loop of a ceramic heater, an RF system monitoring function for an RF treatment system lacking a function module for monitoring the condition of the RF system. It should be understandable that, each embodiment of the present disclosure may implement manual monitoring or online monitoring on abnormal changes of RF signal parameters, and perform feedback control on the RF system according to a monitoring result.

Each embodiment of the present disclosure can give consideration to both monitoring effectiveness and low modification costs, and modification is very simple, convenient, and feasible. Each embodiment of the present disclosure is further applicable to all semiconductor process devices using RF, such as ALD, PECVD, and 3D, and may autonomously define related parameters for different RF systems, thereby effectively lowering the design threshold, and further providing an economical and flexible alternative solution for defects of the technology shown in FIG. 1.

For example (but not limited to), for the PECVD device using the ceramic heating plate shown in FIG. 1, each embodiment of the present disclosure may serve as an alternative solution of upgrading and modifying functions of the RF system; and for a newly-built PECVD device using a ceramic heating plate, each embodiment of the present disclosure may serve as an economical alternative solution for a prototype device test or an RF system monitoring module.

Technical content and technical features of the present disclosure are described by the foregoing related embodiments. However, the foregoing embodiments are merely examples for implementing the present disclosure. Persons skilled in the art may still make replacements and modifications based on the teachings and the disclosure of the present disclosure without departing from the spirit of the present disclosure. Therefore, the disclosed embodiments of the present disclosure do not limit the scope of the present disclosure. On the contrary, modifications and equivalent arrangements included in the spirit and scope of the claims are all included in the scope of the present disclosure.

What is claimed is:

1. A radio frequency (RF) detection apparatus, comprising:
   a high-pass filter (HPF), one end of which is electrically coupled to an RF loop electrode of a ceramic heater, and another end of which is grounded;
   a voltage measurer, connected to the HPF in parallel; and
   a low-pass circuit, connected to the HPF in parallel,
   wherein the HPF is electrically connected to the RF loop electrode through a RF loop line, and
   wherein an ammeter is connected in series on the RF loop line to measure a total current flowing through the HPF and the low-pass circuit.

2. The apparatus according to claim 1, wherein the low-pass circuit comprises a low-pass filter (LPF).

3. The apparatus according to claim 2, further comprising: a resistor, connected to the LPF in series.

4. The apparatus according to claim 1, wherein the low-pass circuit comprises a high-voltage resistor.

5. The apparatus according to claim 1, wherein the voltage measurer comprises a voltmeter.

6. The apparatus according to claim 1, wherein the apparatus is connected to a current measurer, configured to measure a total current flowing through the HPF and the low-pass circuit.

7. The apparatus of claim 1, wherein a system condition is monitored by the RF detection apparatus through the RF loop line.

8. The apparatus of claim 7, wherein the voltage measurer is configured to perform real-time or non-real-time measurement on a parallel voltage of the HPF and the low-pass circuit, thereby monitoring signal parameters of the RF loop electrode through the RF loop line.

9. The apparatus of claim 8, wherein the signal parameters of the RF loop electrode include direct-current bias (Vdc) and RF bias amplitude (Vpp).

* * * * *